Nov. 7, 1967 A. S. GOLDSMITH 3,351,866
AMPLIFIER CIRCUIT HAVING SEPARATE AND INDEPENDENT OUTPUT AND BIASING PATHS
Filed Sept. 18, 1964
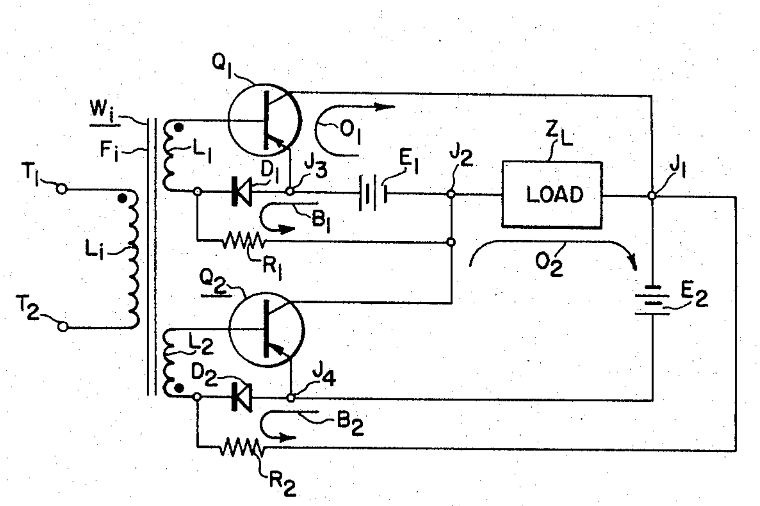
INVENTOR
Alan S. Goldsmith
BY [signature]

United States Patent Office 3,351,866

Patented Nov. 7, 1967

3,351,866

AMPLIFIER CIRCUIT HAVING SEPARATE AND INDEPENDENT OUTPUT AND BIASING PATHS

Alan S. Goldsmith, Plainfield, N.J., assignor to Westinghouse Electric Corporation, Pittsburgh, Pa., a corporation of Pennsylvania Filed Sept. 18, 1964, Ser. No. 397,510
2 Claims. (Cl. 330—15)

The present invention relates to amplifier circuits, and more particularly to diode biased transistor amplifier circuits.

Various transistor audio amplifier circuits have been devised requiring no output transformer between the transistors, usually connected in a push-pull fashion, and the load. A basic disadvantage of many of these circuits is the inability to obtain a stabilized temperature and voltage operating point because of the use of biasing resistors. To overcome this, diodes were substituted for the biasing resistors. Ideally, the voltage-current characteristics of the diode should be substantially similar to those of the emitter-base diode of the transistor. In particular, the matching of the voltage-current characteristics with shifts in temperature is highly desirable for temperature stabilization. Nevertheless, another disadvantage exists in the presently known resistor and diode amplifier circuits in that the output signals of the amplifier and the biasing path are in series. As a consequence of this there is degenerate feedback of the output signals to the input with a resulting loss of power gain. When diode biasing is used, it is essential that the diodes pass a substantial amount of current in order to forward bias the diode into the low impedance portion of its voltage-current characteristic. The impedance of the diode must be small at the input frequency as compared to the input impedance of the transistor or else distortion will result. Since the output signal of the transistor subtracts from the biasing potential, the output and biasing paths being in series, the available biasing current for the diode is limited. It therefore becomes difficult to maintain the diode in its low impedance region without drawing excessive diode current which greatly limits battery life and also limits the life of the diodes. To avert the latter problem electrolytic capacitors could be used to bypass the biasing diodes. However, such capacitors are large expensive and short lived.

It is therefore an object of the present invention to provide a new and improved diode biased transistor amplifier circuit.

It is a further object of the present invention to provide a new and improved amplifier circuit having separate and independent output and biasing paths.

It is a further object of the present invention to provide a new and improved diode biased transistor amplifier circuit having non-interfering output and biasing paths.

Broadly, the present invention provides an amplifier circuit in which a pair of transistors operative in a push-pull manner have diode biasing circuits in which the diodes are maintained in their low impedance state independently of the output circuit, which drives a load without permitting output signals to appear at the input of the transistors to cause degenerate feedback.

These and other objects and advantages of the present invention will become more apparent when considered in view of the following specification and drawing, in which:

The single figure is a schematic diagram showing the amplifier circuit of the present invention.

Referring to the figure, a pair of transistors $Q_1$ and $Q_2$ are connected to operate in a push-pull fashion. An input transformer $W_1$, having a core $F_1$, a primary winding $L_1$, secondary windings $L_1$ and $L_2$, is utilized to drive the transistors $Q_1$ and $Q_2$. Input signals, which, for example, may be at an audio frequency, are applied to a pair of input terminals $T_1$ and $T_2$ of the primary winding $L_1$ of the input transformer $W_1$. By transformer action input signals appear at both of the secondary windings $L_1$ and $L_2$. The phase of the signals appearing at the secondary windings $L_1$ and $L_2$ is determined by the dot convention as shown. The dotted end of the secondary winding $L_1$ is connected to the base electrode of the transistor $Q_1$, while the undotted end of the secondary winding $L_2$ is connected to the base of the transistor $Q_2$. The dotted end of the primary winding $L_1$ is shown at the terminal $T_1$ so it may be assumed that the signals appearing at the secondary winding $L_1$ will be in phase with the input signals at the primary winding $L_1$, while the signals at the winding $L_2$ will be 180° out of phase therewith.

Separate output circuits $O_1$ and $O_2$, as shown by the arrows, are provided to drive the load $Z_L$ in a push-pull fashion. The output circuit $O_1$ includes a series connection of a battery $E_1$, the emitter-collector circuit of the transistor $Q_1$, with the positive terminal of the battery being connected to the emitter electrode, and the load $Z_L$, with the collector electrode of the transistor $Q_1$ being connected to a junction $J_1$, at one end of the load $Z_L$, and the negative electrode of the battery being connected to a junction $J_2$, at the other end of the load $Z_L$. The load $Z_L$, for example, may comprise a resistor or other impedance elements. The other output circuit $O_2$ of the transistor $Q_2$ includes the emitter-collector circuit of the transistor $Q_2$, which has its emitter electrode connected to the positive terminal of a battery $E_2$ and its collector electrode connected to the junction $J_2$ of the load $Z_L$. The series output circuit $O_2$ is completed through the load $Z_L$ which has the junction $J_1$ connected to negative terminal of the battery $E_2$. The batteries $E_1$ and $E_2$ are shown to be separated physically. However, of course, they may form one battery having voltage taps thereon.

Separate and distinct from the output circuits $O_1$ and $O_2$ are biasing circuits $B_1$ and $B_2$, as shown by the arrows in the figure, associated respectively with the transistors $Q_1$ and $Q_2$. Biasing circuit $B_1$ includes the battery $E_1$, a diode $D_1$, which has its anode connected at a junction $J_3$ to the emitter electrode of the transistor $Q_1$ and to the positive terminal of the battery $E_1$, and its cathode connected to the undotted end of the secondary winding $L_1$ and to one end of a resistor $R_1$, whose other end is connected to the negative terminal of the battery $E_1$ at the junction $J_2$. The biasing circuit $B_2$ includes the battery $E_2$, a diode $D_2$ and a resistor $R_2$. The diode $D_2$ has its anode connected at a junction $J_4$ to the emitter electrode of the transistor $Q_2$ and to the positive terminal of the battery $E_2$ and its cathode electrode connected to the dotted end of the secondary winding $L_2$ and to a resistor $R_2$. The other end of the resistor $R_2$ is connected to the negative terminal of the battery $E_2$ at the junction $J_1$.

By such circuit connections, it can be seen that the output circuit $O_1$ and the biasing circuit $B_1$ and the output circuit $O_2$ and the biasing circuit $B_2$ operate independently of each other without output signals in the output circuits interfering with the biasing levels of the respective transistors $Q_1$ and $Q_2$. Thus, incoming audio signals applied to the input terminals $T_1$ and $T_2$ are transformed and appear at the secondary winding $L_1$ and $L_2$ of the transformer $W_1$. The transistors $Q_1$ and $Q_2$ operate in a push-pull fashion so that the transistor $Q_1$ will supply output signals to the load $Z_L$ from the junction $J_1$ to the junction $J_2$ when the input signals applied to the base of the transistor $Q_1$ are of a negative polarity. Conversely, the transistor $Q_2$ will supply output signals to the load $Z_L$ from the junction $J_2$ to the junction $J_1$ when a signal supplied to its base is of a negative polarity or, in other words, when the input signals are of a positive polarity because of the dot convention as described previously. The output signals appearing in the output circuits $O_1$ and $O_2$ do not appear at the input of the respective transistors $Q_1$ and $Q_2$ because the batteries $E_1$ and $E_2$ connected between the load $Z_L$ and the respective emitter electrodes isolate the output circuit from the input of the transistors.

Bias potential is applied to the emitter electrodes of the transistors $Q_1$ and $Q_2$ at the junctions $J_3$ and $J_4$, respectively, from the positive terminal of the batteries $E_1$ and $E_2$. A return path, however, for the biasing current passing through the diodes $D_1$ and $D_2$ is provided by the resistors $R_1$ and $R_2$, respectively, which are connected across the diode and battery series connection. Thus, the biasing circuits $B_1$ and $B_2$ may operate at a predetermined current level so that the diodes $D_1$ and $D_2$ will be in their low impedance regions irrespective of the output signals then appearing in the output circuits $O_1$ and $O_2$. The diodes $D_1$ and $D_2$ are selected to have similar voltage-current characteristics as the corresponding emitter-base diode characteristics of the transistors $Q_1$ and $Q_2$. By such a selection of diodes, the temperature and voltage operating points may be stabilized and thereby improve the overall operation of the amplifier circuit. Moreover, the biasing circuit operating independently of the input circuit limits distortion of incoming signals since the diodes remain throughout both the positive and negative excursion of the incoming signals in their low impedance state.

Although the present invention has been described with a certain degree of particularity, it should be understood that the present disclosure has been made only by way of example and that numerous changes in the details of construction and the combination and arrangement of parts may be resorted to without departing from the scope and the spirit of the present invention.

I claim as my invention:

1. An amplifier circuit operative with a common load comprising, a pair of transistors connected to function in a push-pull manner and each including base, collector and emitter electrodes, said pair of transistors being of the same conductivity type, input circuit means for applying input signals to the base electrodes of each of said transistors so that said transistors function in a push-pull manner, a biasing circuit connected respectively to each of said transistors, each biasing circuit including a source of direct potential, a diode and an impedance device operatively connected to forward bias said diode, said source being operatively connected to the emitter electrode of the respective transistor to supply bias potential thereto, and an output circuit respectively connected to each of said transistors to drive said common load, said collector electrodes of said pair of transistors directly connected respectively to opposite ends of said load, each output circuit including one of said separate sources of direct potential, the emitter-collector circuit of the respective transistor and said load and operative to function independently of said biasing circuits, with current being supplied through said load in opposite directions from each of said output circuits respectively.

2. An amplifier circuit operative with a common load comprising, a pair of transistors connected to function in a push-pull manner and each including base, collector and emitter electrodes, said pair of transistors being of the same conductivity type, input circuit means for applying input signals to the base electrodes of each of said transistors so that said transistors function in a push-pull manner, a biasing circuit connected respectively to each of said transistors, each biasing circuit including a separate source of direct potential, a diode and an impedance device operatively connected in series to forward bias said diode, the voltage-current characteristics of said diode substantially matching these characteristics of the emitter-base diode of the respective transistor, said separate sources being operatively connected to the emitter electrode of the respective transistor to supply bias potential thereto, and an output circuit connected respectively to each of said transistors to drive said common load, said collector electrodes of said pair of transistors directly connected respectively to opposite ends of said load, each output circuit including one of said separate sources of direct potential, the emitter-collector circuit of the respective transistor and said load and being operatively connected in series to function independently of said biasing circuits with output signals appearing in said output circuits not affecting the biasing levels of either of said transistors, with current being supplied through said load in opposite directions from each of said output circuits respectively.

References Cited

UNITED STATES PATENTS 2,860,193 11/1958 Lindsay ---------- 330—15 XR

FOREIGN PATENTS 626,699 4/1963 Belgium.

ROY LAKE, *Primary Examiner.*

NATHAN KAUFMAN, *Examiner.*

E. C. FOLSOM, F. D. PARIS, *Assistant Examiners.*